United States Patent
Miyaji et al.

(10) Patent No.: US 10,408,868 B2
(45) Date of Patent: Sep. 10, 2019

(54) MOTOR DRIVE CONTROL DEVICE AND METHOD FOR DETERMINING CONTROLLED FREQUENCY FOR MOTOR

(71) Applicant: Minebea Mitsumi Inc., Nagano (JP)

(72) Inventors: Shigeki Miyaji, Hamamatsu (JP); Kazuo Takada, Kosai (JP); Kei Yamazaki, Ota-ku (JP)

(73) Assignee: MINEBEA MITSUMI INC., Nagano (JP)

( * ) Notice: Subject to any disclaimer, the term of this patent is extended or adjusted under 35 U.S.C. 154(b) by 0 days.

(21) Appl. No.: 15/912,876

(22) Filed: Mar. 6, 2018

(65) Prior Publication Data

US 2018/0259560 A1  Sep. 13, 2018

(30) Foreign Application Priority Data

Mar. 8, 2017 (JP) .................. 2017-043566

(51) Int. Cl.

| | |
|---|---|
| *G01R 23/20* | (2006.01) |
| *H02P 6/28* | (2016.01) |
| *G01R 23/02* | (2006.01) |
| *H02P 8/02* | (2006.01) |
| *H02P 8/12* | (2006.01) |
| *H02P 27/08* | (2006.01) |
| *H02P 29/50* | (2016.01) |

(52) U.S. Cl.
CPC .............. *G01R 23/20* (2013.01); *G01R 23/02* (2013.01); *H02P 6/28* (2016.02); *H02P 8/02* (2013.01); *H02P 8/12* (2013.01); *H02P 27/085* (2013.01); *H02P 29/50* (2016.02); *H02P 2209/09* (2013.01)

(58) Field of Classification Search
CPC . G01R 23/20; H02P 6/28; H02P 29/50; H02P 8/12

USPC ......................................................... 318/671
See application file for complete search history.

(56) References Cited

U.S. PATENT DOCUMENTS

| | | | |
|---|---|---|---|
| 2005/0064842 A1* | 3/2005 | Patel | ...................... H04B 15/02 |
| | | | 455/345 |
| 2006/0097685 A1* | 5/2006 | Shin | .......................... H02P 8/12 |
| | | | 318/696 |
| 2007/0252625 A1 | 11/2007 | Shin et al. | |

FOREIGN PATENT DOCUMENTS

| | | |
|---|---|---|
| JP | 2006-094650 A | 4/2006 |
| JP | 2006-136138 A | 5/2006 |
| JP | 2007-295744 A | 11/2007 |
| JP | 2012-062044 A | 3/2012 |
| JP | 2016-042681 A | 3/2016 |

OTHER PUBLICATIONS

Japanese Office Action dated Jul. 29, 2019 for corresponding Japanese Application No. 2017-043566.

* cited by examiner

*Primary Examiner* — Kawing Chan
(74) *Attorney, Agent, or Firm* — Pearne & Gordon LLP

(57) ABSTRACT

In accordance with one aspect of the present disclosure, a motor drive control device is a motor drive control device performing PWM (Pulse Width Modulation) control of a motor, wherein harmonics of a fundamental frequency for PWM control of the motor are included in noise occurring from the motor; the fundamental frequency for PWM control is larger than a frequency corresponding to a bandwidth of a predetermined radio frequency band a communication apparatus uses; and frequencies of continuous harmonic components of the fundamental frequency for PWM control appear before and after the predetermined radio frequency band.

13 Claims, 6 Drawing Sheets

(f×n), f×(n+1): NOISE HARMONIC COMPONENTS
$f_L$: LOWER-LIMIT FREQUENCY OF AREA THAT CANNOT BE USED
$f_H$: HIGHER-LIMIT FREQUENCY OF AREA THAT CANNOT BE USED (f×n), f×(n+1): NOISE HARMONIC COMPONENTS
$f_L$: LOWER-LIMIT FREQUENCY OF AREA THAT CANNOT BE USED
$f_H$: HIGHER-LIMIT FREQUENCY OF AREA THAT CANNOT BE USED (f×n), f×(n+1): NOISE HARMONIC COMPONENTS
$f_L$: LOWER-LIMIT FREQUENCY OF AREA THAT CANNOT BE USED
$f_H$: HIGHER-LIMIT FREQUENCY OF AREA THAT CANNOT BE USED

MOTOR DRIVE CONTROL DEVICE AND METHOD FOR DETERMINING CONTROLLED FREQUENCY FOR MOTOR

CROSS REFERENCE TO RELATED APPLICATIONS

This application claims the benefit of Japanese Patent Application No. 2017-043566, filed Mar. 8, 2017, which is hereby incorporated by reference in its entirety.

BACKGROUND

Technical Field

This disclosure relates to a motor drive control device, a method for deciding a controlled frequency for a motor and a program for determining the controlled frequency for the motor, and in particular to a motor drive control device taking measures against motor noise, a method for determining a controlled frequency for a motor and a program for determining the controlled frequency for the motor.

Background

Conventionally, techniques for preferably performing communication in a wireless communication system (specifically, a smart entry system) in which a vehicle is involved have been proposed (for example, see Japanese Patent Application Laid-Open No. 2012-62044).

A communication control system according to Japanese Patent Application Laid-Open No. 2012-62044 is provided with detection means for detecting an operation state of vehicle equipment to be a noise source, estimation means for, based on the operation state of the vehicle equipment detected by the detection means, estimating electromagnetic noise characteristics specific to the operation state, and selection means for selecting a communication method according to the electromagnetic noise characteristics estimated by the estimation means.

SUMMARY

Japanese Patent Application Laid-Open No. 2012-62044 is for selecting a communication method according to estimated electromagnetic noise characteristics, and it is not for improving an operation state of vehicle equipment to be a noise source. Therefore, using the conventional techniques, it is not possible to avoid occurrence of noise.

The present disclosure is related to providing a motor drive control device capable of taking measures against motor noise, a method for determining a controlled frequency for a motor and a program for determining the controlled frequency for the motor.

In accordance with one aspect of the present disclosure, a motor drive control device is a motor drive control device performing PWM (Pulse Width Modulation) control of a motor, wherein harmonics of a fundamental frequency for PWM control of the motor are included in noise occurring from the motor; the fundamental frequency for PWM control is larger than a frequency corresponding to a bandwidth of a predetermined radio frequency band a communication apparatus uses; and frequencies of continuous harmonic components of the fundamental frequency for PWM control appear before and after the predetermined radio frequency band.

Preferably, a frequency at a center between a frequency of the n-th harmonic and a frequency of the (n+1)th harmonic, which are the continuous harmonic components, approximately corresponds to a center frequency of the predetermined radio frequency band.

Preferably, the fundamental frequency for PWM control is set within a predetermined range of frequency; and, among a plurality of fundamental frequencies included in the predetermined range of frequency, harmonic components of the plurality of fundamental frequencies not being included in the predetermined radio frequency band, a highest frequency is selected as the fundamental frequency for PWM control of the motor.

Preferably, the fundamental frequency for PWM control of the motor is set such that peaks of the continuous harmonic components of the fundamental frequency for PWM control of the motor do not enter a magnetic flux area determined according to the predetermined radio frequency band the communication apparatus uses.

Preferably, the motor drive control device further comprises means for inputting an instruction signal from a host device; and the fundamental frequency for PWM control of the motor is changeable based on the instruction signal from the host device.

Preferably, the communication apparatus is a smart entry system, and a radio frequency band used by the communication apparatus is an LF band; and the fundamental frequency for PWM control of the motor is set within a range of 20 kHz to 30 kHz.

In accordance with another aspect of this disclosure, in a method for determining a fundamental frequency of a motor driven by PWM control, harmonics of a fundamental frequency for PWM control of the motor are included in noise occurring from the motor; and the method for determining the fundamental frequency of the motor driven by PWM control decides the fundamental frequency of the motor such that the fundamental frequency for PWM control is larger than a frequency corresponding to a bandwidth of a predetermined radio frequency band a communication apparatus uses, and frequencies of continuous harmonic components of the fundamental frequency for PWM control appear before and after the predetermined radio frequency band.

In accordance with still another aspect of this disclosure, in a program for determining a fundamental frequency of a motor driven by PWM control, harmonics of a fundamental frequency for PWM control of the motor are included in noise occurring from the motor; and the program for determining the fundamental frequency of the motor driven by PWM control causes a computer to execute a step of determining the fundamental frequency of the motor such that the fundamental frequency for PWM control is larger than a frequency corresponding to a bandwidth of a predetermined radio frequency band a communication apparatus uses, and frequencies of continuous harmonic components of the fundamental frequency for PWM control appear before and after the predetermined radio frequency band.

According to this disclosure, it becomes possible to provide a motor drive control device, a method for determining a controlled frequency for a motor and a program for determining the controlled frequency for the motor capable of taking measures against noise of the motor.

DETAILED DESCRIPTION

Hereinafter, a case where the present disclosure is applied to an onboard system for a car will be described by giving a specific example. The present disclosure can be especially preferably implemented in a case where a communication device and a motor exist within a relatively short distance (several centimeters to several meters) like an onboard system, and there is a possibility that the communication device is influenced by noise of the motor. An application scope of the present disclosure, however, is not limited to an onboard system, and the present disclosure can be applied to any environment if the environment is provided with a communication device and a motor.

First Embodiment

Figure 1:
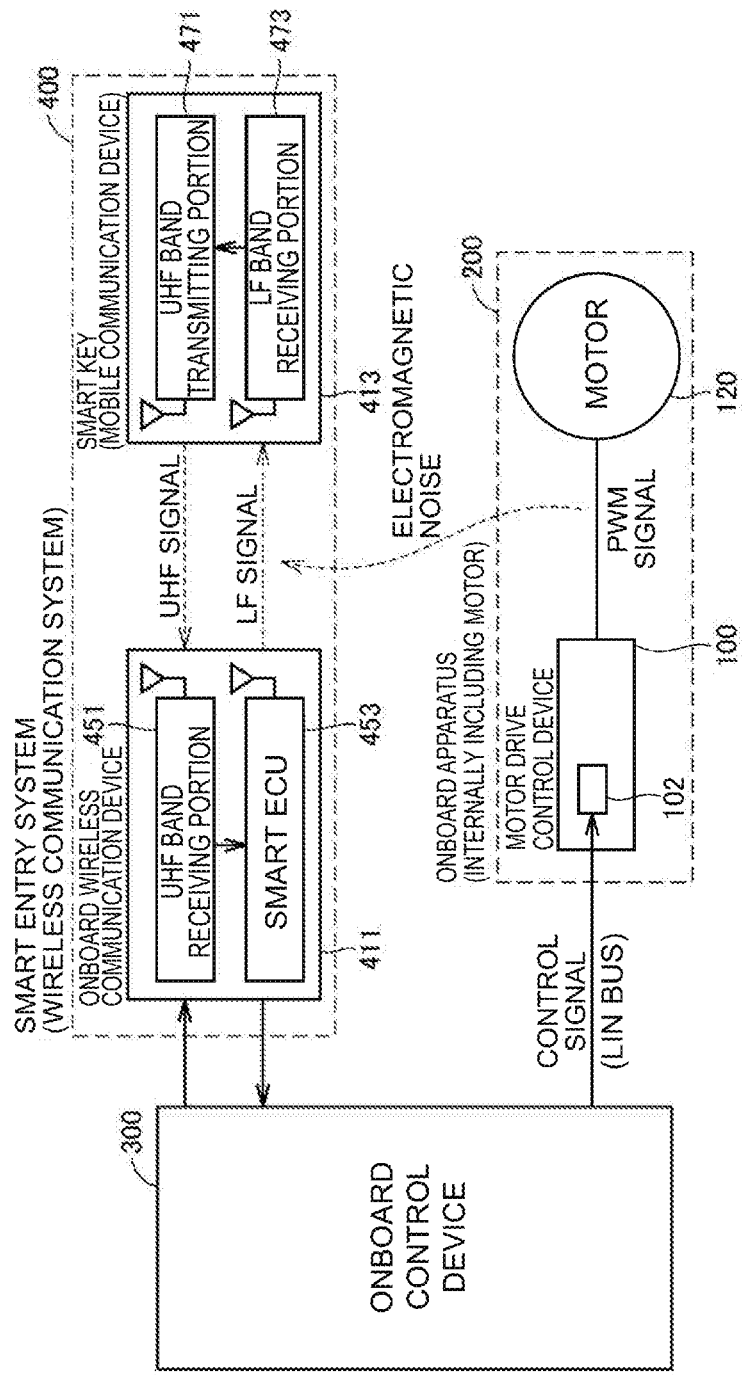
FIG. 1 is a block diagram showing a configuration of an onboard system in a first embodiment of the present disclosure.

FIG. 1 is a block diagram showing a configuration of an onboard system in a first embodiment of the present disclosure.

The onboard system shown in FIG. 1 is configured with an onboard control device 300 (a specific example of a host device) provided with a CPU (a computer), a memory, a nonvolatile storage device and the like, and a smart entry system 400 (a specific example of a wireless communication system; an example of a communication apparatus) and an onboard apparatus 200 internally including a motor 120. That is, in the present embodiment, the communication apparatus is the smart entry system 400, and a radio frequency band used by the communication apparatus is an LF band.

The smart entry system 400 is configured with an onboard wireless communication device 411 installed in a car and a smart key 413 (a specific example of a mobile communication device) a driver wears.

The onboard wireless communication device 411 is provided with a receiving portion 451 for a UHF (Ultra High Frequency) band and a smart ECU (Electronic Control Unit) 453.

The smart key 413 is internally provided with a UHF band transmitting portion 471 and an LF (Low Frequency) band receiving portion 473. Communication of UHF signals is performed between the UHF band transmitting portion 471 and the UHF band receiving portion 451, and communication of LF signals is performed between the smart ECU 453 and the LF band receiving portion 473.

When the driver approaches the vehicle or touches an outer handle of a door in a state of wearing the smart key 413, communication is performed between the onboard wireless communication device 411 and the smart key 413, and the vehicle is unlocked if conditions are satisfied.

More specifically, the smart key 413 sends a UHF signal. Here, for example, a frequency of 312.125 MHz or the like is used. The smart ECU 453 functions as a transmitting portion in the onboard wireless communication device 411 and is provided with an exterior LF antenna and an interior LF antenna built in the outer handle or the like. For transmission by the smart ECU 453, a frequency band around 125 kHz is used.

At the time the car is unlocked, for example, when the driver touches the outer handle while wearing the smart key 413, a touch sensor built in the outer handle recognizes change in capacitance and transmits a signal to the onboard wireless communication device 411. The onboard wireless communication device 411 receiving the signal transmits an LF signal to the exterior LF antenna. The smart key 413 receiving the LF signal transmits a UHF signal including an authentication signal. The UHF band receiving portion 451 receiving the UHF signal transmits a signal giving the OK to unlock to the onboard control device 300. The onboard control device 300 receiving the signal giving the OK to unlock transmits a driving signal to a door lock actuator (not shown) to unlock the door.

A lot of onboard apparatuses provided with a motor are mounted in the car. As a representative onboard apparatus, the onboard apparatus 200 is shown in FIG. 1. The motor may be a rotary motor or a linear motor. The motor 120 here is a concept including an actuator. The onboard apparatus 200 is provided with a motor drive control device 100 and the motor 120 electrically connected to the motor drive control device 100. The onboard control device 300 transmits a control signal to the motor drive control device 100 thorough a LIN (Local Inter Connect Network) bus. The motor drive control device 100 transmits a PWM (Pulse Width Modulation) signal to the motor 120 based on the control signal from the onboard control device 300. Receiving the PWM signal, the motor 120 rotates (or linearly moves).

When the motor 120 is driven, electromagnetic noise occurs, and there is a possibility that the electromagnetic noise influences communication performed in the smart entry system 400. More specifically, there is a possibility that harmonic components of a fundamental frequency for PWM control of the motor 120 will interfere with a used frequency band of the transmitting portion (=a used frequency band received by the receiving portion) of the smart entry system 400. A degree of this interference is determined by a method for shielding the motor 120, a distance between the onboard apparatus 200 internally including the motor 120 and the smart entry system 400, drive voltage/drive current of the motor 120, the fundamental frequency for PWM control of the motor 120, magnetic flux density of the noise and the like. In the motor drive control device 100 in the present embodiment, harmonics of the fundamental frequency for PWM control of the motor 120 are included in the noise occurring from the motor 120; and, as described later, the fundamental frequency for PWM control is larger than a frequency corresponding to a bandwidth of a predetermined radio frequency band the smart entry system 400 uses, and frequencies of continuous harmonic components of the fundamental frequency for PWM control appear before and after the predetermined radio frequency band.

Figure 2:
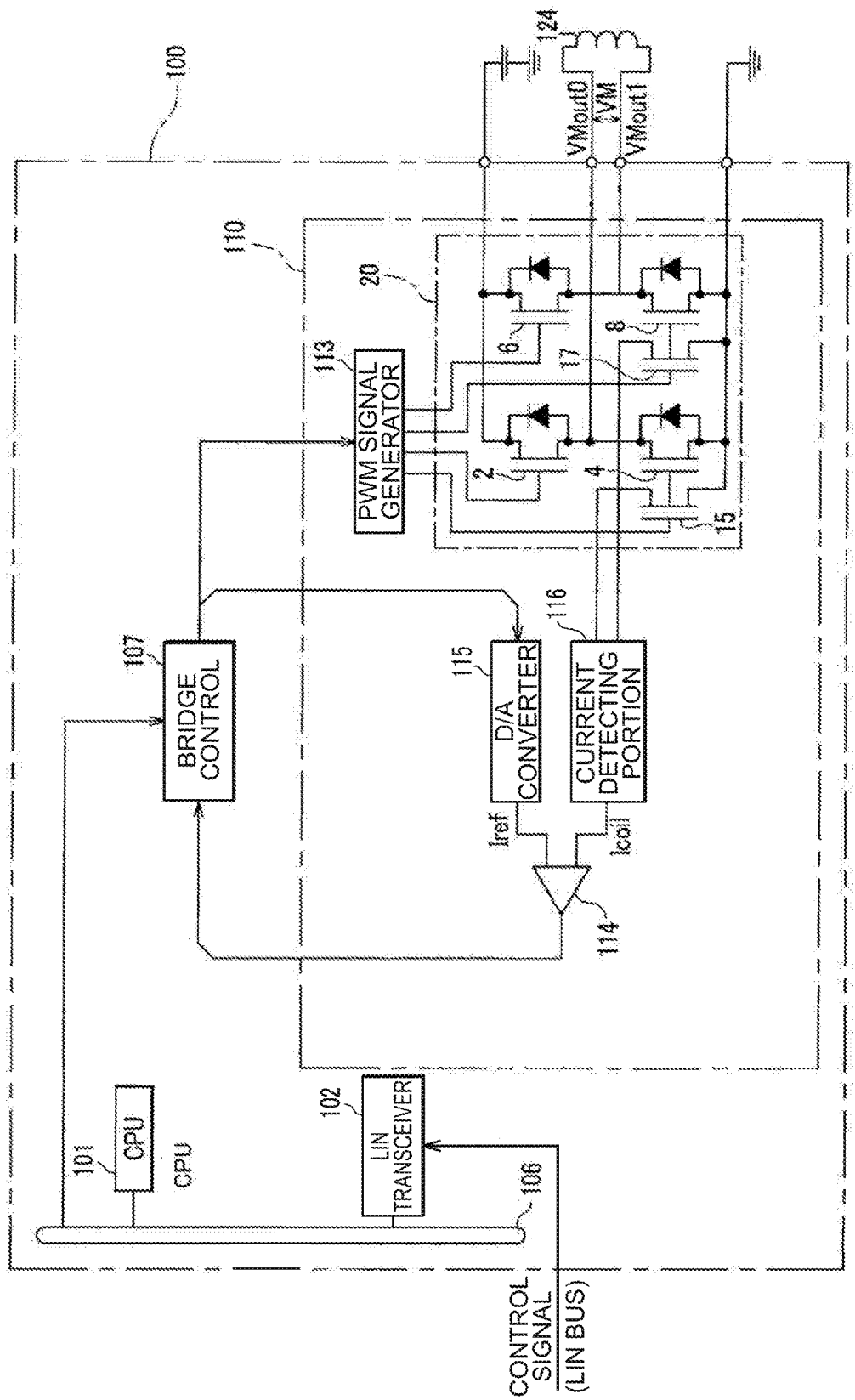
FIG. 2 is a block diagram showing a configuration of an onboard apparatus 200 in FIG. 1.

FIG. 2 is a block diagram showing a configuration of the onboard apparatus 200 in FIG. 1.

A CPU 101 (an example of control means or a computer) provided inside the motor drive control device 100 controls each portion via a bus 106. A bridge control portion 107 controls each portion of a bridge control circuit 110 based on a command from the CPU 101.

The bridge control circuit 110 is configured as an integral integrated circuit. Inside the bridge control circuit 110, a PWM signal generator 113 generates a PWM signal and supplies the PWM signal to an H bridge circuit 20, based on control by the bridge control portion 107. The H bridge circuit 20 includes FETs (Field Effect Transistors) 2, 4, 6 and 8 and FETs 15 and 17. In FIG. 2, lower-side terminals of these FETs are source ends, and upper-side terminals are drain ends. The PWM signal is an ON/OFF signal applied to these FETs as gate voltage.

Voltage VMout0 at a connection point Mout0 between the FETs 2 and 4 is applied to one end of a stator winding 124 of the motor 120 (FIG. 1). Further, voltage VMout1 at a connection point Mout1 between the FETs 6 and 8 is applied to another end of the stator winding 124. Therefore, motor voltage VM, a difference between both voltages, is applied to the stator winding 124. The motor voltage VM is actually X-phase voltage VMX and Y-phase voltage VMY.

A current detecting portion 116 detects a motor current flowing through the stator winding 124. Specifically, the current detecting portion 116 outputs a current measurement value Icoil of the current flowing through the stator winding 124 by measuring a value of a current flowing through the FETs 15 and 17 according to a current direction. A D/A converter 115 receives a digital value of a current reference value Iref from the bridge control portion 107 and converts the digital value to an analog value. A comparator 114 compares the current measurement value Icoil and the current reference value Iref, which are analog values. The comparator 114 outputs a "1" signal if the former is equal to or larger than the latter, and outputs a "0" signal in other cases.

Figure 3:
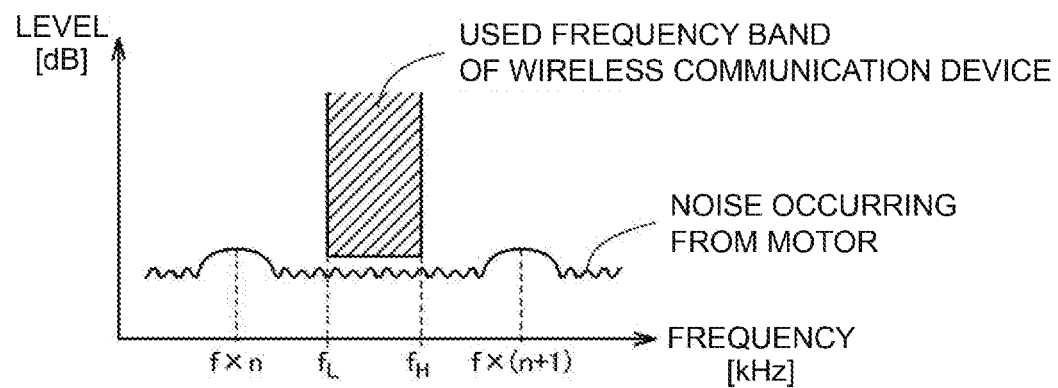
FIG. 3 is a diagram showing relationships of levels of harmonic components of a fundamental frequency for PWM control of a motor relative to a used frequency band (a used frequency area) of a smart entry system (a wireless communication device) in the first embodiment.

FIG. 3 is a diagram showing relationships of levels of the harmonic components of the fundamental frequency f for PWM control of the motor 120 relative to the used frequency band (the used frequency area) of the smart entry system 400 in the first embodiment.

In FIG. 3, a horizontal axis indicates frequencies (kHz), and a vertical axis indicates signal levels (dB) at the frequencies. The used frequency band of the smart entry system 400 is indicated by hatching. That is, a frequency band from fL kHz to fH kHz is used by the smart entry system 400 here.

As shown in FIG. 3, when constant current control is performed for the motor 120 (assumed to be a stepping motor here) by PWM, mountains (peaks) of electromagnetic noise, which are harmonic components $f \times n$ ($n=1, 2, 3, \ldots$) kHz of a fundamental frequency f for PWM, occur outside the motor 120. When the harmonic components interfere with a frequency band of a wireless communication device using a low frequency band (such as the smart entry system 400 using a frequency around 125 kHz), a malfunction may be caused.

In the motor drive control device 100 in the present embodiment, the fundamental frequency f for PWM control is optimized so that the noise occurring from the motor 120 does not influence the frequency band from fL kHz to fH kHz (so that the influence is reduced as far as possible).

More specifically, an appropriate PWM fundamental frequency f satisfying the following conditions is set so as to avoid the used frequency band of the smart entry system 400.

First, since it is necessary that the PWM fundamental frequency f be larger than a width of the frequency band from fL kHz to fH kHz (the used area of the smart entry system 400), the PWM fundamental frequency f is set so as to satisfy a condition of the following formula (1).

$$f > fH - fL \qquad \text{Formula (1)}$$

Secondly, in order that the frequency band from fL kHz to fH kHz exist between mountains (at a center between mountains) of the harmonics of the motor 120, the PWM fundamental frequency f is set so as to satisfy a relation of the following formula.

$$\{f \times n + f \times (n+1)\}/2 = (fL + fH)/2 \text{ (wherein } n=1,2,3,\ldots)$$

When being transformed, the above formula can be expressed as follows.

$$f = (fL + fH)/(2 \times n + 1) \qquad \text{Formula (2)}$$

That is, according to Formula (2), the PWM fundamental frequency f is set such that a frequency at a center between a frequency of the n-th harmonic and a frequency of the (n+1)th harmonic, which are continuous harmonic components, approximately corresponds to a center frequency of the predetermined radio frequency band.

Thirdly, as for a range of setting the PWM fundamental frequency f, since motor sound worsens when the PWM fundamental frequency f is 20 kHz or below, and a calculation load on the CPU 101 increases when the PWM fundamental frequency f is 30 kHz or above, it is assumed in this embodiment that the PWM fundamental frequency f is set within a range of $$20 \text{ kHz} < f < 30 \text{ kHz} \qquad \text{Formula (3)}$$

That is, the fundamental frequency f for PWM control of the motor 120 is set within a range of 20 kHz to 30 kHz.

The PWM fundamental frequency f is set such that the above formulas (1) to (3) are satisfied. For example, if fL=120 kHz and fH=130 kHz are set, a PWM fundamental frequency f satisfying the above formulas (1) to (3) is 22.7 kHz or 27.8 kHz.

The motor drive control device 100 sets the fundamental frequency f for PWM control for motor driving at 22.7 kHz or 27.8 kHz and then drives the motor 120. Thereby, it is possible to drive the motor 120 such that the noise occurring from the motor 120 does not influence the frequency band from fL to fH (such that the influence decreases as far as possible).

As described above, in the motor drive control device 100, the fundamental frequency f for PWM control is larger than the frequency ((fH−fL) kHz) corresponding to a bandwidth of a predetermined radio frequency band the onboard apparatus 200 uses, and frequencies (($f \times n$) kHz and $f \times (n+1)$ kHz) of continuous harmonic components of the PWM fundamental frequency f for PWM control appear before and after the predetermined radio frequency band.

In this case, it is more preferable to adopt 27.8 kHz as the fundamental frequency f for PWM control. This is because, within a range of frequency the CPU 101 can calculate, an interval between the frequencies of continuous harmonic components is wider when the fundamental frequency f for PWM control is higher, and, as a result, it is possible to cause the noise to be far away from the used frequency band of the smart entry system 400.

Thus, the PWM fundamental frequency f for PWM control is set within a predetermined frequency range (in the present example, 20 kHz to 30 kHz), and, among a plurality of fundamental frequencies included in a predetermined frequency range, harmonic components of the plurality of fundamental frequencies not being included in a predetermined radio frequency band, the highest frequency (in the present example, 27.8 kHz) is selected as the fundamental frequency f for PWM control of the motor 120.

Second Embodiment

Since a hardware configuration and the like of an onboard system in a second embodiment is the same as those in the first embodiment, the description will be not repeated.

Figure 4:
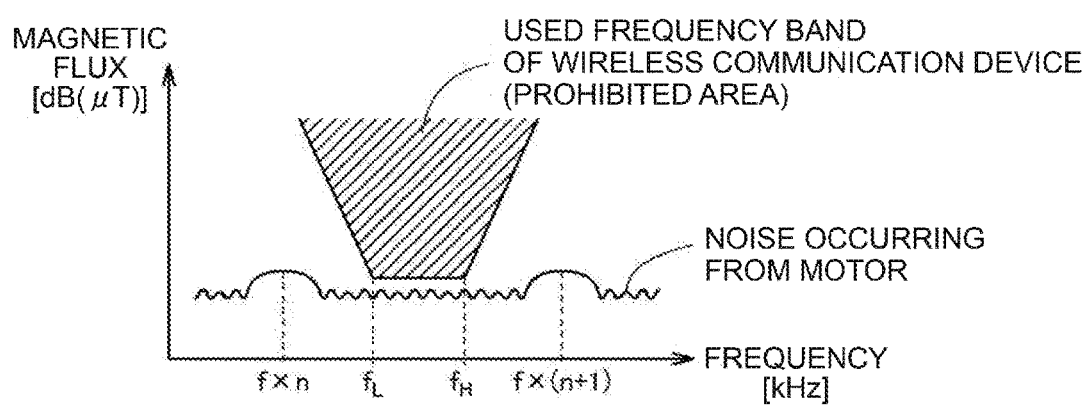
FIG. 4 is a diagram showing relationships of magnetic fluxes of the harmonic components of the fundamental frequency for PWM control of the motor relative to a magnetic flux area determined according to the used frequency band of the smart entry system (the wireless communication device) in a second embodiment.

FIG. 4 is a diagram showing relationships of magnetic fluxes of the harmonic components of the fundamental frequency f for PWM control of the motor 120 relative to a magnetic flux area of a used frequency band of the smart entry system 400 in the second embodiment. As described below in detail, in the motor drive control device 100 of the present embodiment, the fundamental frequency f for PWM control of the motor 120 is set such that peaks of continuous harmonic components of the fundamental frequency f for PWM control of the motor 120 do not enter a magnetic flux area determined according to the predetermined radio frequency band the smart entry system 400 (an example of a communication apparatus) uses.

In FIG. 4, a horizontal axis indicates frequencies (kHz), and a vertical axis indicates magnetic flux densities [dB (µT)]. The used frequency band (the used frequency area) of the smart entry system 400 is indicated by hatching. Since influence on adjacent frequencies increases as a level of noise becomes larger, the used frequency band of the smart entry system 400 (an area the use of which by other devices is prohibited) is in a trapezoid shape as indicated by the hatching in FIG. 4.

Similarly to the first embodiment, the PWM fundamental frequency f of the motor 120 is set larger than a frequency corresponding to the bandwidth of the radio frequency band the smart entry system 400 uses ((fH−fL) kHz in FIG. 4), and the fundamental frequency f for PWM control of the motor 120 is set such that the frequencies of continuous harmonic components of the PWM fundamental frequency f of the motor 120 appear before and after the radio frequency band. Further, the PWM fundamental frequency f of the motor 120 is set such that peaks of continuous harmonic components of the PWM fundamental frequency f of the motor 120 do not enter the magnetic flux area of the radio frequency band the smart entry system 400 uses, the magnetic flux area being indicated by the trapezoid in FIG. 4.

The magnetic flux density of the noise occurring from the motor 120 changes according to a distance from the motor 120, presence or absence of a shield and the like. In order to set the PWM fundamental frequency f of the motor 120 such that the peaks of continuous harmonic components of the PWM fundamental frequency f of the motor 120 do not enter the magnetic flux area indicated by the trapezoid in FIG. 4, a calculation result of the magnetic flux density of the noise occurring from the motor 120, by simulation or the like, and actual measurement value of a level of the noise from the motor 120 are used.

Figure 5:
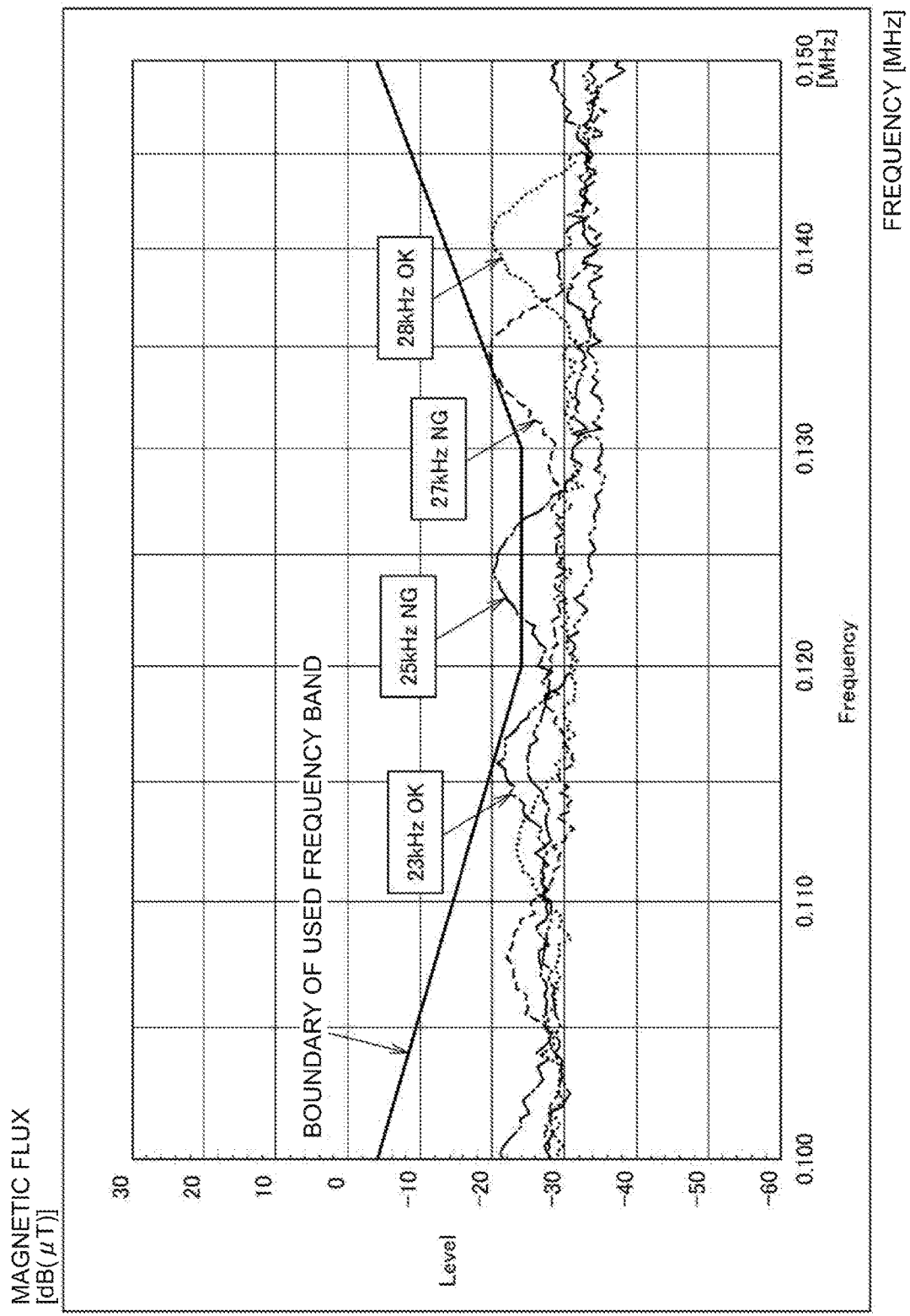
FIG. 5 is a diagram showing actual measurement values of the levels of the harmonic components of the fundamental frequency for PWM control of the motor relative to the magnetic flux area determined according to the used frequency band of the smart entry system (the wireless communication device) in the second embodiment.

FIG. 5 is a diagram showing actual measurement values of the levels of the harmonic components of the fundamental frequency f for PWM control of the motor 120 relative to the magnetic flux area of the used frequency band of the smart entry system 400 in the second embodiment.

In FIG. 5, a horizontal axis indicates frequencies (kHz), and a vertical axis indicates magnetic flux densities [dB (µT)].

In FIG. 5, a boundary of the used frequency band of the smart entry system 400 is shown by a solid line. The PWM fundamental frequency f of the motor 120 must be set such that the noise of the motor 120 does not enter a part above the solid line.

In FIG. 5, harmonic components in the case of setting the fundamental frequency f for PWM control (the PWM fundamental frequency f) of the motor 120 to 23 kHz (in the present example, a frequency obtained by rounding 22.7 kHz described above is used), 25 kHz, 27 kHz and 28 kHz (in the present example, a frequency obtained by rounding 27.8 kHz described above is used) are shown by broken lines. For example, when the fundamental frequency f for PWM control of the motor 120 is 23 kHz, peaks of the noise appear near 115 kHz (0.115 MHz) corresponding to 23 kHz×5 and near 138 kHz (0.138 MHz) corresponding to 23 kHz×6. For example, when the fundamental frequency f for PWM control of the motor 120 is 25 kHz, peaks of the noise appear near 125 kHz (0.125 MHz) corresponding to 25 kHz×5 and near 150 kHz (0.150 MHz) corresponding to 25 kHz×6.

As shown in FIG. 5, when the fundamental frequency f for PWM control of the motor 120 is 25 kHz, the harmonic components of the fundamental frequency f enter the magnetic flux area of the used frequency band of the smart entry system 400. Therefore, 25 kHz cannot be used as the fundamental frequency f for PWM control of the motor 120.

When the fundamental frequency f for PWM control of the motor 120 is 27 kHz, a harmonic component of the fundamental frequency f touches the boundary of the magnetic flux area of the used frequency band of the smart entry system 400 (or approaches the boundary). Therefore, 27 kHz cannot be used as the fundamental frequency f for PWM control of the motor 120.

When the fundamental frequency f for PWM control of the motor 120 is 23 kHz or 28 kHz, the harmonic components of the fundamental frequency f do not enter the magnetic flux area of the used frequency band of the smart entry system 400 in either of the cases. Therefore, 23 kHz or 28 kHz can be used as the fundamental frequency f for PWM control of the motor 120. In this case, it is more preferable to adopt 28 kHz. This is because, within a range of frequency the CPU 101 can calculate, an interval between the frequencies of continuous harmonic components is wider when the PWM fundamental frequency f for PWM control is higher, and, as a result, it is possible to cause the noise to be far away from the used frequency band of the smart entry system 400.

Figure 6:
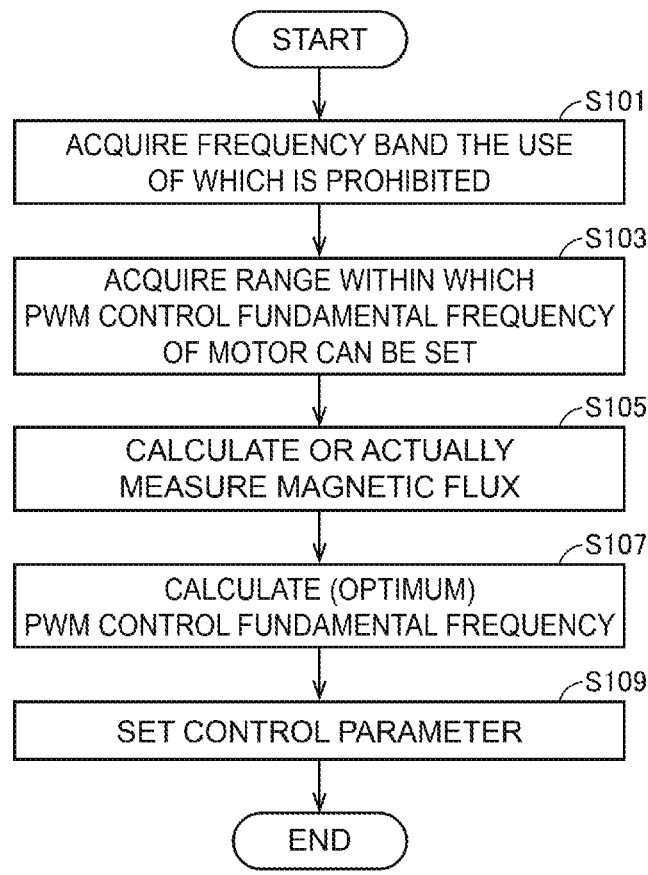
FIG. 6 is a flowchart showing a method for calculating an optimum fundamental frequency for PWM control of the motor.

FIG. 6 is a flowchart showing a method for calculating an optimum fundamental frequency f of a PWM signal. On a method for determining the fundamental frequency f of the motor 120 driven by PWM control, harmonics of the fundamental frequency f for PWM control of the motor 120 are included in the noise occurring from the motor 120, the fundamental frequency f of the motor 120 is determined such that the fundamental frequency f for PWM control is larger than a frequency ((fH−fL) kHz) corresponding to a bandwidth of a predetermined radio frequency band a communication apparatus uses, and frequencies ((f×n) kHz and f×(n+1) kHz) of continuous harmonic components of the fundamental frequency f for PWM control appear before and after the predetermined radio frequency band. Further, a program for determining the fundamental frequency f of the motor 120 driven by PWM control causes, since the harmonics of the fundamental frequency f for PWM control of the motor 120 are included in the noise occurring from the motor 120, a computer to execute a step of determining the fundamental frequency f of the motor 120 such that the fundamental frequency f for PWM control is larger than a frequency ((fH−fL) kHz) corresponding to a bandwidth of a predetermined radio frequency band a communication apparatus uses, and frequencies ((f×n) kHz and f×(n+1) kHz) of continuous harmonic components of the fundamental frequency f for PWM control appear before and after the predetermined radio frequency band.

A process shown by this flowchart may be executed by a computer. Otherwise, the PWM fundamental frequency f of the motor 120 may be calculated by artificially performing calculation according to the flowchart, and a drive parameter of the PWM fundamental frequency f of the motor 120 may be set for the device based on the calculated PWM fundamental frequency f.

At step S101 in FIG. 6, acquisition of information about the predetermined radio frequency band the smart entry system 400 (an example of a communication apparatus) uses (a band the use of which is prohibited) is performed. At step S103, a range within which the fundamental frequency f for PWM control of the motor 120 can be set is acquired. For example, in Formula (3) described above, the range is the range of 20 kHz<f<30 kHz.

At step S105, strength of a magnetic flux (magnetic flux density) of noise of the motor 120 is obtained by calculation or actual measurement. In the first embodiment, this process is unnecessary.

At step S107, a fundamental frequency f for PWM control satisfying all of Formulas (1) to (3) described above is calculated. If there are a plurality of fundamental frequencies f, the highest frequency among the fundamental frequencies may be selected. Further, in the second embodiment, the fundamental frequency f is calculated such that peaks of the noise of the motor 120 do not enter the trapezoid-shaped area the use of which is prohibited.

At step S109, a control parameter for performing PWM control of the motor 120 by the fundamental frequency f is set for the motor drive control device 100, and, after that, driving of the motor 120 is performed.

Further, the motor drive control device 100 is further provided with means 102 (shown in FIG. 2 as LIN Transceiver) for inputting a signal from a host device and is capable of changing the fundamental frequency f for PWM control of the motor 120 based on an instruction from the host device. That is, the device may be configured so as to, if a new frequency band the use of which is prohibited is acquired from the onboard control device 300, which is the host device, through a LIN bus, perform the process from step S101 again so that an update to a new fundamental frequency f is performed. That is, the fundamental frequency f may be changeable by an instruction signal of the onboard control device 300 when a radio frequency to be used is changed.

[Effects by the Embodiments]

In this way, it is possible to avoid noise due to operation of the motor 120 from interfering with the radio frequency band used in the wireless communication system. As a result, it is possible to satisfy EMC (Electro-Magnetic Compatibility) specifications requested by a user of the motor 120.

Further, even if the radio frequency band to be used is changed, it is possible to change the PWM fundamental frequency f to such a PWM fundamental frequency f such that noise interference with the radio frequency band does not occur, by communication (a command) through LIN or the like.

[Others]

The motor is not limited to a stepping motor but may be another kind of motor such as a brushless motor.

Though the above embodiments are configured so as to control a stepping motor with a constant current, it is not necessary to limit the control with a constant current.

Further, the wireless communication system is not limited to a smart entry system. Furthermore, the radio frequency band is not limited to an LF band.

The present disclosure is not limited to automotive application but can be also applied, for example, to a motor for changing an illumination direction in an illumination system, a communication device provided with a motor, a computer apparatus used near a motor and the like.

The above embodiments should be thought to be illustrative in all points but not restrictive in any point. The scope of the present disclosure is shown not by the description above but by the scope of the claims, and it is intended that meanings equal to the scope of the claims and all changes made within the scope be included.

What is claimed is:

1. A motor drive control device performing PWM (Pulse Width Modulation) control of a motor, the motor drive control device being configured to:
   when harmonics of a fundamental frequency for PWM control of the motor are included in noise occurring from the motor, determine the fundamental frequency for PWM control such that:
      the fundamental frequency for PWM control is larger than a frequency corresponding to a bandwidth of a predetermined radio frequency band a communication apparatus uses; and
      frequencies of continuous harmonic components of the fundamental frequency for PWM control appear before and after the predetermined radio frequency band; and
   set the fundamental frequency for PWM control of the motor such that a frequency at a center between a frequency of the n-th harmonic and a frequency of the (n+1)th harmonic, which are the continuous harmonic components of the fundamental frequency for PWM control, approximately corresponds to a center frequency of the predetermined radio frequency band.

2. The motor drive control device according to claim 1, further comprising means for inputting an instruction signal from a host device, wherein
   the fundamental frequency for PWM control of the motor is changeable based on the instruction signal from the host device.

3. The motor drive control device according to claim 1, wherein
   the communication apparatus is a smart entry system, and a radio frequency band used by the communication apparatus is a low frequency band; and
   the fundamental frequency for PWM control of the motor is set within a range of 20 kHz to 30 kHz.

4. A motor drive control device performing PWM (Pulse Width Modulation) control of a motor, the motor drive control device being configured to:
   when harmonics of a fundamental frequency for PWM control of the motor are included in noise occurring from the motor, determine the fundamental frequency for PWM control such that:

the fundamental frequency for PWM control is larger than a frequency corresponding to a bandwidth of a predetermined radio frequency band a communication apparatus uses; and frequencies of continuous harmonic components of the fundamental frequency for PWM control appear before and after the predetermined radio frequency band; and set the fundamental frequency for PWM control within a predetermined range of frequency, wherein among a plurality of fundamental frequencies included in the predetermined range of frequency, harmonic components of the plurality of fundamental frequencies are not being included in the predetermined radio frequency band, and a highest frequency is selected as the fundamental frequency for PWM control of the motor.

5. The motor drive control device according to claim 4, further comprising means for inputting an instruction signal from a host device; wherein the fundamental frequency for PWM control of the motor is changeable based on the instruction signal from the host device.

6. The motor drive control device according to claim 4, wherein the communication apparatus is a smart entry system, and a radio frequency band used by the communication apparatus is a low frequency band; and the fundamental frequency for PWM control of the motor is set within a range of 20 kHz to 30 kHz.

7. The motor drive control device according to claim 4, wherein the fundamental frequency for PWM control of the motor is set such that a frequency at a center between a frequency of the n-th harmonic and a frequency of the (n+1)th harmonic, which are the continuous harmonic components of the fundamental frequency for PWM control, approximately corresponds to a center frequency of the predetermined radio frequency band.

8. The motor drive control device according to claim 4, wherein the fundamental frequency for PWM control of the motor is set such that peaks of the continuous harmonic components of the fundamental frequency for PWM control of the motor do not enter a magnetic flux area determined according to the predetermined radio frequency band the communication apparatus uses.

9. A motor drive control device performing PWM (Pulse Width Modulation) control of a motor, the motor drive control device being configured to:

when harmonics of a fundamental frequency for PWM control of the motor are included in noise occurring from the motor, determine the fundamental frequency for PWM control such that:

the fundamental frequency for PWM control is larger than a frequency corresponding to a bandwidth of a predetermined radio frequency band a communication apparatus uses; and frequencies of continuous harmonic components of the fundamental frequency for PWM control appear before and after the predetermined radio frequency band; and set the fundamental frequency for PWM control of the motor such that peaks of the continuous harmonic components of the fundamental frequency for PWM control of the motor do not enter a magnetic flux area determined according to the predetermined radio frequency band the communication apparatus uses.

10. The motor drive control device according to claim 9, wherein the fundamental frequency for PWM control of the motor is set such that a frequency at a center between a frequency of the n-th harmonic and a frequency of the (n+1)th harmonic, which are the continuous harmonic components of the fundamental frequency for PWM control, approximately corresponds to a center frequency of the predetermined radio frequency band.

11. The motor drive control device according to claim 9, further comprising means for inputting an instruction signal from a host device; wherein the fundamental frequency for PWM control of the motor is changeable based on the instruction signal from the host device.

12. The motor drive control device according to claim 9, wherein the communication apparatus is a smart entry system, and a radio frequency band used by the communication apparatus is an low frequency band; and the fundamental frequency for PWM control of the motor is set within a range of 20 kHz to 30 kHz.

13. A method for determining a controlled frequency of a motor driven by PWM control, wherein harmonics of a fundamental frequency for PWM control of the motor are included in noise occurring from the motor; and the method decides the fundamental frequency of the motor such that the fundamental frequency for PWM control is larger than a frequency corresponding to a bandwidth of a predetermined radio frequency band a communication apparatus uses, and frequencies of continuous harmonic components of the fundamental frequency for PWM control appear before and after the predetermined radio frequency band, wherein the fundamental frequency for PWM control of the motor is set such that a frequency at a center between a frequency of the n-th harmonic and a frequency of the (n+1)th harmonic, which are the continuous harmonic components of the fundamental frequency for PWM control, approximately corresponds to a center frequency of the predetermined radio frequency band.

* * * * *